United States Patent
Sundaresan

(10) Patent No.: US 6,753,576 B1
(45) Date of Patent: Jun. 22, 2004

(54) METHOD OF FABRICATING A ONE-SIDED POLYSILICON THIN FILM TRANSISTOR

(75) Inventor: Ravishankar Sundaresan, Garland, TX (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 08/193,725

(22) Filed: Feb. 9, 1994

Related U.S. Application Data

(63) Continuation of application No. 07/860,983, filed on Mar. 31, 1992, now abandoned.

(51) Int. Cl.[7] .............................................. H01L 29/76
(52) U.S. Cl. ......................... 257/344; 257/66; 257/408
(58) Field of Search ............................... 357/23.3, 23.4; 257/67, 71, 344, 345, 369, 401, 903, 408, 393, 69, 64, 66, 70

(56) References Cited

U.S. PATENT DOCUMENTS

| | | | | |
|---|---|---|---|---|
| 4,581,623 A | * | 4/1986 | Wang | 257/67 |
| 4,686,758 A | * | 8/1987 | Liu et al. | 437/34 |
| 4,952,825 A | * | 8/1990 | Yoshida | 307/475 |
| 5,112,764 A | * | 5/1992 | Mitra et al. | 438/163 |
| 5,198,379 A | * | 3/1993 | Adan | 438/151 |
| 5,262,655 A | * | 11/1993 | Ashida | 257/66 |

FOREIGN PATENT DOCUMENTS

| | | | |
|---|---|---|---|
| JP | 7132365 | * | 8/1982 |
| JP | 3260162 | * | 10/1988 |
| JP | 0214172 | * | 8/1989 |
| JP | 0260857 | * | 10/1989 |
| JP | 0023669 | * | 1/1990 |
| JP | 0094478 | * | 4/1990 |
| JP | 0197173 | * | 8/1990 |

OTHER PUBLICATIONS

Wolf et al., Silicon Processing for the VLSI Era, vol. 1—Process Technology, 1986, Lattice Press, pp. 308–309.*
Fichtner, et al., "Experimental results in submicron–Size P–Channel MOSFET's", IEEE Electron Device Letters, vol. EDL–3, No. 2, Feb. 1982.*
Article entitled "A Polysilicon Transistor Technology for Large Capacity SRAMs" by S. Ikeda et al, IEDM 90, pp. 469–472, 1990.
Article entitled "A 5.9 um$^2$ Super Low Power SRAM Cell Using a New Phase–Shift Lightography" by T. Yamanaka et al, IEDM 90, pp. 477–480, 1990.
Ohkubo et al., "16Mbit SRAM Cell Technologies for 2.OV Operation", 1991 IEEE, IEDM pp. 91–481–91–484.
Liu et al., "Inverted Thin–Film Transistors with a Simple Self–Aligned Lightly Doped Drain Structure", IEEE Transactions on Electron Devices, Vo. 39, No. 12, Dec. 1992.
Liu et al., "High Reliability and High Performance 0.35 $\mu$m Gate–Inverted TFT's for 16Mbit SRAM Applications Using Self–Aligned LDD Structures", 1992 IEEE, IEDM 92–823–92–826.
Hayashi et al., "A High Performance Polysilicon TFT Using RTA and Plasma Hydrogenation Applicable to Highly Stable SRAMs of 16Mbit and Beyond", 1992 Symposium on VLSI Technology Digest of Technical Papers, 1992 IEEE, pp. 36–37.

* cited by examiner

Primary Examiner—George Eckert
(74) Attorney, Agent, or Firm—Lisa K. Jorgenson; William A. Munck

(57) ABSTRACT

An asymmetrical polysilicon thin film transistor is formed above a gate electrode on a semiconductor substrate. The transistor is separated from the gate electrode by a gate oxide layer, and includes a channel region immediately above the gate electrode. Highly doped source/drain regions are formed within the polysilicon on either side of the channel region. On the drain side of the channel only, a lightly doped drain region is formed between the channel region and the highly doped drain region. The highly doped source region is immediately adjacent the channel region.

4 Claims, 1 Drawing Sheet

METHOD OF FABRICATING A ONE-SIDED POLYSILICON THIN FILM TRANSISTOR

This is a continuation of application Ser. No. 07/860,983, filed Mar. 31, 1992 now abandoned.

FIELD OF THE INVENTION

The present invention relates generally to semiconductor integrated circuit processing, and more specifically to a method of forming a one-sided polysilicon thin film transistor.

BACKGROUND OF THE INVENTION

The basic SRAM cell can be formed using cross-coupled CMOS inverters having 2 each n-channel and p-channel transistors. The cell is accessed by, typically, 2 n-channel control gates for a standard SRAM cell and 4 control gates for 2-port memory devices. To conserve physical layout space, the p-channel transistors are often replaced with resistive loads.

Use of the p-channel transistors as the load devices for the SRAM cell, however, results in the cell having better electrical characteristics. Such cells are faster than those using resistive loads, since the p-channel transistors provide a higher drive current than high resistance devices. Also, use of p-channel transistors gives higher immunity to soft errors, such as those caused by alpha particle impacts and noise. The primary disadvantage of SRAM cells incorporating p-channel load transistors is that the layout area for each cell is significantly larger than those using resistive loads. This reduces device density and increases chip costs.

Bottom-gated polysilicon PMOS transistors, or an inverted form of the transistors, are often used as the p-channel transistors or load devices in the SRAM cell. Stacking the p-channel transistors over the n-channel transistors increases device density. Today, the polysilicon PMOS transistors are used, for example, as the load devices in four megabit SRAM cells to improve the stability of the cell and reduce the cell's stand-by current. These load devices, generally termed thin film transistors, may be built in 10 to 100 nanometers of polysilicon deposited on top of an oxide layer. In most applications, the gate of the thin film transistor is shielded at the bottom of the transistor body by a layer of oxide as shown in the prior art FIG. 1. After the gate 50 formation, a gate oxide layer is formed over the gate thus encapsulating the gate. A thin film of polysilicon 52 is deposited covering the gate. The thin film of polysilicon is appropriately doped to form an n-type channel region above the gate and p$^+$ source and drain regions adjacent to the n-type channel region and above the gate.

The typical bottom-gated thin film transistor, however, has a high grain-junction leakage current. The presence of grain boundary traps between, for example, the p$^+$ drain region and the n-type channel region causes field-enhanced generation current. This field enhanced current causes the leakage or off-state current of the cell to be high.

Several methods have been proposed to control the field-enhanced current in the bottom-gated polysilicon thin film transistor. See, for example, A Polysilicon Transistor Technology for Large Capacity SRAMs, by Ikeda et al, IEDM 469–472, 1990 and A 59 um$^2$ Super Low Power SRAM Cell Using a New Phase-Shift Lithography, by T. Yamanaka et al, IEDM 477–480, 1990. A gate to drain off-set structure of the polysilicon PMOS transistor is proposed whereby the leakage current and the stand-by dissipation power required for the memory cell are reduced to more acceptable levels.

As shown in prior art FIG. 2, the heavily doped p$^+$ drain region 54 is offset from the transistor gate 50. However, the lightly doped n-type channel region which extends further over the transistor gate has the same doping concentration as the gate which results in some additional current loss. It would therefore be desirable to provide an improved off-set structure which reduces the drain electric field without compromising the drive current. It would further be desirable to form the improved structure utilizing current fabrication techniques easily adapted for use with standard integrated circuit process flows.

SUMMARY OF THE INVENTION

The invention may be incorporated into a method for forming a semiconductor device structure, and the semiconductor device structure formed thereby, by forming a first conductive structure over a portion of the integrated circuit. A first dielectric layer is formed over the first conductive structure. A polysilicon layer, having a first and a second end, is formed over the first dielectric layer. A channel region is formed in the polysilicon layer substantially over the first conductive structure. A source region is formed in the polysilicon layer adjacent to the first end of the channel region. A LDD region is formed in the polysilicon layer adjacent to the second end of the channel region. A drain region is formed in the polysilicon layer adjacent to the LDD region.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
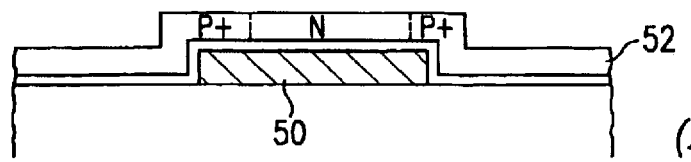
FIG. 1 illustrates the prior art bottom-gated polysilicon PMOS transistor.
Figure 2:
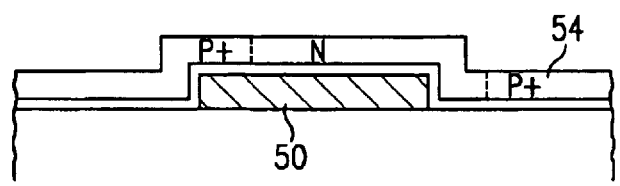
FIG. 2 illustrates the prior art off-set gate to drain structure of the polysilicon PMOS transistor.
Figure 3:
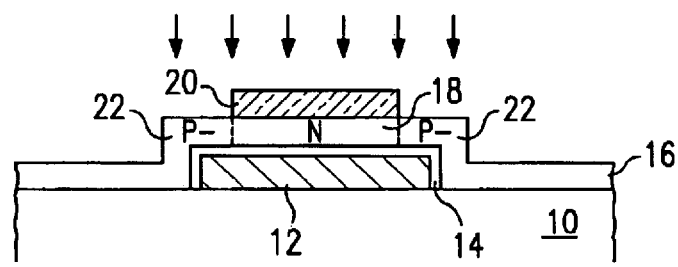
FIGS. 3–6 are the cross-sectional views of the fabrication of a semiconductor device structure according to the present invention.

Referring to FIG. 3, an integrated circuit device is to be formed on a dielectric layer 10. A polysilicon gate electrode 12 is formed over the substrate 10. The polysilicon gate 12 is appropriately doped with a p-type dopant such as boron or an n-type dopant such as arsenic or phosphorous as known in the art. A dielectric layer 14 is formed over the integrated circuit encapsulating the gate electrode 12. Layer 14 may typically be an oxide or an oxide/nitride composite. A substantially planar polysilicon layer 16 is then formed over the device to form the source/drain and channel regions of a transistor. This structure represents a bottom-gated transistor. The transistor is inverted from a traditional transistor structure which has a gate on top with a source/drain and channel region in the substrate. This structure represents a polysilicon PMOS thin film transistor having a gate on the bottom with the source/drain and channel regions overlying the gate in a second polysilicon layer.

The polysilicon layer 16 is appropriately doped with an n-type dopant such as phosphorous or a p-type dopant such as boron to adjust the threshold voltage to a desired value. The dopant used to adjust the threshold voltage forms the n-type channel region 18 overlying the gate 12. An oxide layer is then formed over the polysilicon layer 16, patterned and etched to form a screen oxide region 20. The screen oxide 20 is formed over the region of the polysilicon layer 16 which is to remain doped with an n-type dopant forming the n-type channel region 18. The screen oxide layer 20 has a thickness of between approximately 1500 to 3000 angstroms. Alternatively, the screen oxide layer may comprise an oxide/nitride stack. The purpose of the screen oxide layer 20 is to protect the n-type channel region from subsequent implants. A blanket $p^-$ implant is performed as represented by the arrows to form the lightly doped drain (LDD) $p^-$ regions 22 on either side of the n-type channel-region 18.

Figure 4:
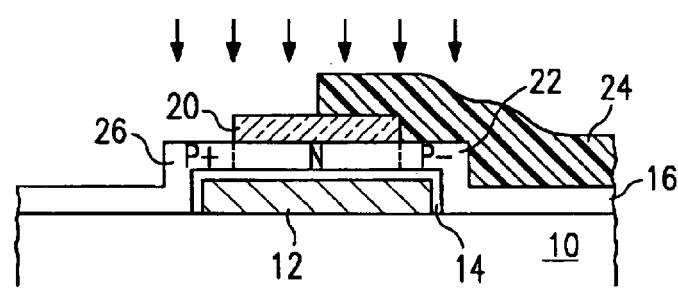

Referring to FIG. 4, a photoresist layer 24 is formed over the device and patterned to expose a portion of the screen oxide layer 20 and the source region 22 in the polysilicon layer 16. A heavily doped $p^+$ source region 26 is formed by implantation as represented by the arrows. The dopant used to form the heavily doped source region may be boron fluoride ($BF_2$) to a concentration of $10^{20}/cm^3$. This $p^+$ source region will typically be connected to Vcc and is on top of the gate and thus does not contribute to any series resistance.

Figure 5:
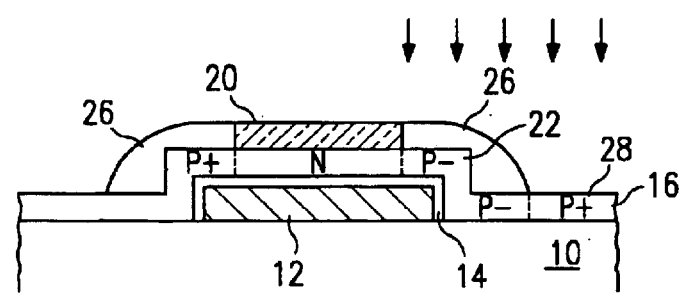

Referring to FIG. 5, the photoresist layer 24 is removed. An oxide layer is deposited over the device. Sidewall oxide spacers 26 are then formed by an etchback of the oxide layer. A blanket $p^+$ implant is performed as represented by the arrows to form a heavily doped $p^+$ drain region 28 in polysilicon layer 16 which is off-set from the gate 12. The length of the sidewall spacers 26 will define the length of the $p^-$ LDD region 22. The transistor leakage current will be proportional to the length of the LDD region 22. Thus, a longer p_ type LDD region 22 will lower the leakage current.

Figure 6:
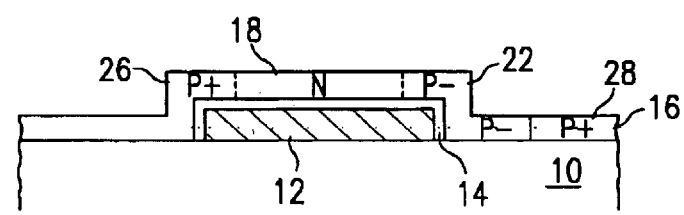

Referring to FIG. 6, the screen oxide region 20 and the sidewall spacers 26 are removed. A wet etch process may be used using the polysilicon layer 16 as an etch stop. The screen oxide no longer contributes to the topography since it is removed. Conventional planarization processes may be performed followed by contact via and metallization processes. An offset gate to drain structure is formed starting with a traditional polysilicon PMOS thin film transistor. A $p^+$ source/drain region and an n-type channel region are formed. In this invention, however, a $p^-$ LDD region is formed between the n-type channel and the more heavily doped $p^+$ drain. This structure will reduce the field enhanced junction leakage. The leakage or off-state current of the transistor will be minimized providing for more stable electrical characteristics.

As will be appreciated by those skilled in the art, the process steps described above can be used with nearly any conventional process flow. While the invention has been particularly shown and described with reference to a preferred embodiment, it will be understood by those skilled in the art that various changes in form and detail may be made therein without departing from the spirit and scope of the invention.

What is claimed is:

1. A structure consisting of a portion of an integrated circuit; comprising:

a gate electrode having an upper surface and substantially vertical side surfaces;

a gate oxide layer disposed over the upper and side surfaces of the gate electrode; and a polysilicon conductive element overlying the gate oxide layer, and lying adjacent to the gate electrode side surfaces and separated therefrom by the gate oxide layer, and further extending along a surface away from the gate electrode, the polysilicon conductive element comprising;

an n-type channel region substantially centered over the gate electrode;

a uniformly doped $p^+$-type source region adjacent to a first end of the channel region and extending from a location above the gate electrode to an end of the polysilicon conductive element;

a p-type lightly doped drain region adjacent to a second end of the channel region, and extending from a location above the gate electrode upper surface to a portion of the polysilicon conductive element which extends away from the gate electrode; and a $p^+$-type drain region adjacent to the p-type lightly doped drain region.

2. The structure of claim 1, wherein the n-type channel region comprises phosphorous.

3. The structure of claim 2, wherein the p-type lightly doped drain region comprises a region containing $BF_2$ having a dopant concentration of between approximately $10^{12}$ to $10^{13}/cm^2$.

4. The structure of claim 1, wherein the $p^+$-type regions comprise regions containing $BF_2$ having a dopant concentration of approximately $10^{15}/cm^2$.

* * * * *